(12) United States Patent
Tseng et al.

(10) Patent No.: US 12,196,806 B2
(45) Date of Patent: Jan. 14, 2025

(54) AGING TEST SYSTEM AND AGING TEST METHOD FOR THERMAL INTERFACE MATERIAL AND ELECTRONIC DEVICE TESTING APPARATUS HAVING THE SYSTEM

(71) Applicant: CHROMA ATE INC., Taoyuan (TW)

(72) Inventors: I-Shih Tseng, Taoyuan (TW); Xin-Yi Wu, Taoyuan (TW); Chin-Yi Ouyang, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 132 days.

(21) Appl. No.: 18/054,197

(22) Filed: Nov. 10, 2022

(65) Prior Publication Data

US 2023/0375615 A1 Nov. 23, 2023

(30) Foreign Application Priority Data

May 17, 2022 (TW) .................................. 111118333

(51) Int. Cl.
  *G01R 31/28* (2006.01)
  *G01R 1/44* (2006.01)
  *G01R 35/00* (2006.01)
(52) U.S. Cl.
  CPC ........... *G01R 31/2891* (2013.01); *G01R 1/44* (2013.01); *G01R 35/00* (2013.01)
(58) Field of Classification Search
  CPC .. G01R 31/2891; G01R 31/2886; G01R 1/44; G01R 35/00
  See application file for complete search history.

(56) References Cited

U.S. PATENT DOCUMENTS

| 10,067,483 | B1 * | 9/2018 | Ho | G05B 19/4065 |
| 2015/0333758 | A1 * | 11/2015 | Gomi | G06F 1/28 327/115 |
| 2018/0017613 | A1 * | 1/2018 | Qiao | G01R 31/2619 |
| 2018/0108957 | A1 * | 4/2018 | Sheng | G05D 23/19 |
| 2021/0325453 | A1 * | 10/2021 | Chan | G01R 31/2874 |
| 2021/0331419 | A1 * | 10/2021 | Yamazaki | B29C 64/106 |

* cited by examiner

*Primary Examiner* — Dominic E Hawkins
(74) *Attorney, Agent, or Firm* — McClure, Qualey & Rodack, LLP

(57) ABSTRACT

The present invention relates to an aging test system and an aging test method for a thermal interface material and an electronic device testing apparatus having the system, wherein a controller controls a movable carrier to move to a high temperature generating device so that the thermal interface material on the movable carrier is brought into contact with the high temperature generating device; the controller further controls a temperature sensor to detect the temperature of the thermal interface material; the controller compares an output temperature datum of the high temperature generating device with a temperature measurement datum detected by the temperature sensor. Accordingly, the thermal conductivity of the thermal interface material can be obtained for immediately determining the quality and the performance degradation of the thermal interface material, which can be used as a reference for selection or replacement of the thermal interface material.

10 Claims, 5 Drawing Sheets

AGING TEST SYSTEM AND AGING TEST METHOD FOR THERMAL INTERFACE MATERIAL AND ELECTRONIC DEVICE TESTING APPARATUS HAVING THE SYSTEM

BACKGROUND OF THE INVENTION

Field of the Invention

The present invention relates to an aging test system and aging test method for a thermal interface material, in particular to an accessory system which can be arranged in an electronic device testing apparatus.

Description of the Related Art

In order to eliminate defective products, electronic devices must be subjected to function tests during the manufacturing process or before factory shipment. Reference is made to FIG. 1, which is a schematic diagram of a conventional electronic device testing apparatus. As shown in the figure, a chip to be tested DUT is accommodated in a test socket 92, and the chip to be tested DUT is pressed from above by a pressing head 91 to ensure that the chip to be tested DUT can be completely in contact with a plurality of contacts in the test socket 92 (not shown in the figure).

Furthermore, a temperature control unit TCU is disposed in the pressing head 91 for heating or cooling the chip under test DUT. For example, in the case of a high temperature test or a low temperature test, the chip under test DUT is heated to a specific high temperature or cooled to a specific low temperature by the temperature control unit TCU, and then the test is performed. On the other hand, in the case of a normal temperature test, the temperature control unit TCU of the pressing head 91 is capable of extracting heat generated by the chip under test DUT during the testing process to ensure the operation performance of the chip under test DUT.

However, the upper surface of the chip under test DUT and the lower surface of the pressing head 91 are rigid surfaces. In a microscopic level, these two surfaces are rough surfaces. Bring these two surfaces into complete contact with each other is impossible, and some air gaps are inevitably interposed therebetween. Air has a small thermal conductivity of 0.024 W/(m·K), causing a relatively large contact thermal resistance. Therefore, in the prior art, a thermal conductive interface material 93 is disposed on the lower surface of the pressing head 91 to fill the air gaps so that the contact thermal resistance can be reduced and the thermal conductivity can be improved.

However, after the thermal conductive interface material 93 is used for a period of time, the thermal conductivity of the thermal conductive interface material 93 is degraded, thereby affecting the temperature control or heat extraction effect and making the chip under test DUT overheated. It would result in test failure and affect the yield rate detection. There is no relevant mechanism in the prior art to detect the thermal conductivity of the thermal conductive interface material 93. Usually, the cause of misjudgment is found after chips under test DUT are continuously determined as defective products due to high temperature. At this time, the aged thermal conductive interface material 93 would be replaced with a new one. However, not only the above situation affects the yield rate detection but also the machine efficiency is affected by downtime to inspect and replace the thermal conductive interface material 93.

SUMMARY OF THE INVENTION

The main object of the present invention is to provide an aging test system and aging test method for a thermal interface material and an electronic device testing apparatus having the system capable of monitoring the performance of the thermal interface material and detecting the aging state of the thermal interface material so that a warning can be issued in advance for notifying a user to replace the thermal interface material, thereby improving the yield rate detection and operation efficiency of the apparatus.

To achieve the above object, the present invention provides an aging test system for a thermal interface material disposed on a movable carrier, the system mainly comprising: a high temperature generating device, at least one temperature sensor and a controller, wherein the high temperature generating device is controlled to output a steady temperature or a transient temperature change as an output temperature datum; the at least one temperature sensor is disposed on the movable carrier and controlled to detect a temperature of the thermal interface material as a temperature measurement datum; the controller is electrically connected to the movable carrier, the high temperature generating device and the at least one temperature sensor, the controller controls the movable carrier to move to the high temperature generating device so that the thermal interface material is brought into contact with the high temperature generating device; the controller controls the at least one temperature sensor to detect the temperature of the thermal interface material; the controller compares the output temperature datum of the high temperature generating device with the temperature measurement datum detected by the at least one temperature sensor.

Accordingly, in the aging test system for a thermal interface material of the present invention, by bringing the high-temperature generating device into contact with the thermal interface material and then detecting the temperature of the thermal interface material, the thermal conductivity of the thermal interface material can be obtained for immediately determining the quality and degradation of the performance of the thermal interface material, which can be used as a reference for selection or replacement of the thermal interface material.

To achieve the above object, the present invention provides an electronic device testing apparatus, which comprises a pressing head, a high temperature generating device, at least one temperature sensor, a test socket and a controller, wherein the pressing head includes a thermal interface material; the high temperature generating device is controlled to output a steady temperature or a transient temperature change as an output temperature datum; the at least one temperature sensor is disposed on the pressing head and controlled to detect a temperature of the thermal interface material as a temperature measurement datum; the test socket is used for accommodating an electronic device under test; and the controller is electrically connected to the pressing head, the high temperature generating device, the at least one temperature sensor and the test socket; the controller controls the pressing head to move to the high temperature generating device so that the thermal interface material is brought into contact with the high temperature generating device; the controller controls the at least one temperature sensor to detect the temperature of the thermal interface material; the controller compares the output temperature datum of the high temperature generating device with the temperature measurement datum detected by the at least one temperature sensor.

Accordingly, the electronic device testing device of the present invention has a mechanism for detecting the aging state of the thermal interface material, by which the thermal conductivity of the thermal interface material can be determined timely. When the performance of the thermal interface material is degraded, a warning can be issued in advance for notifying a user to replace the thermal interface material, thereby improving the yield rate detection and operation efficiency of the apparatus.

To achieve the above object, the present invention provides an aging test method for a thermal interface material, which comprises the steps of: controlling a movable carrier to move to a high temperature generating device by a controller so that a thermal interface material on the movable carrier is brought into contact with the high temperature generating device, wherein the high temperature generating device is controlled to output a steady temperature or a transient temperature change as an output temperature datum; controlling a temperature sensor on the movable carrier to detect a temperature of the thermal interface material and to output a temperature measurement datum by the controller; and comparing the output temperature datum of the high temperature generating device with the temperature measurement datum detected by the temperature sensor by the controller.

Accordingly, the present invention provides a novel aging test method for a thermal interface material capable of quickly and effectively determining the thermal conductivity or aging state of the thermal interface material, so as to avoid use of a thermal interface material having poor performance and to effectively avoid the damage to electronic devices caused by the deterioration of the performance of the thermal interface material.

DESCRIPTION OF THE PREFERRED EMBODIMENTS

Figure 1:
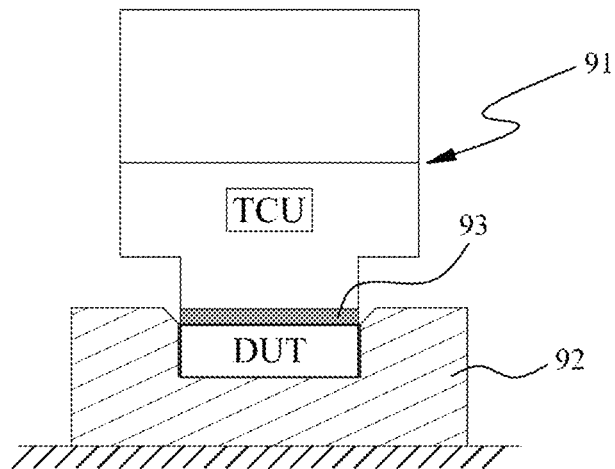
FIG. 1 is a schematic diagram of a conventional electronic device testing apparatus.

Before an aging test system and aging test method for a thermal interface material and an electronic device testing apparatus having the system according to the present invention are described in detail in the embodiments, it should be noted that in the following description, similar components will be designated by the same reference numerals. Furthermore, the drawings of the present invention are for illustrative purposes only, they are not necessarily drawn to scale, and not all details are necessarily shown in the drawings.

The following embodiments are directed to a pressing device. During a testing process, a device under test (DUT) is continuously pressed from above by a pressing head to ensure that the device under test (DUT) is in electric contact with pogo pins in a test socket while the pressing head is capable of controlling the temperature of the device under test or extracting heat from the device under test. However, it should be noted that the present invention is not limited to the pressing device, and the present invention is suitable for any device that needs to detect the aging degree of a thermal interface material.

Figure 2:
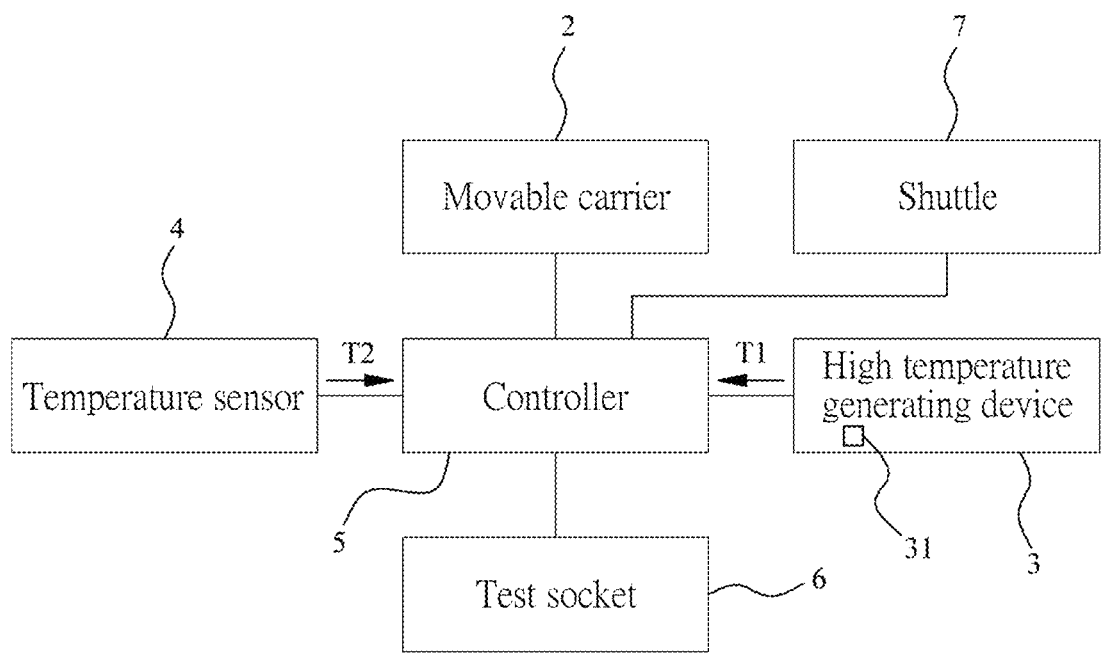
FIG. 2 is a block diagram of an apparatus according to a first embodiment of the present invention.
Figure 3A:
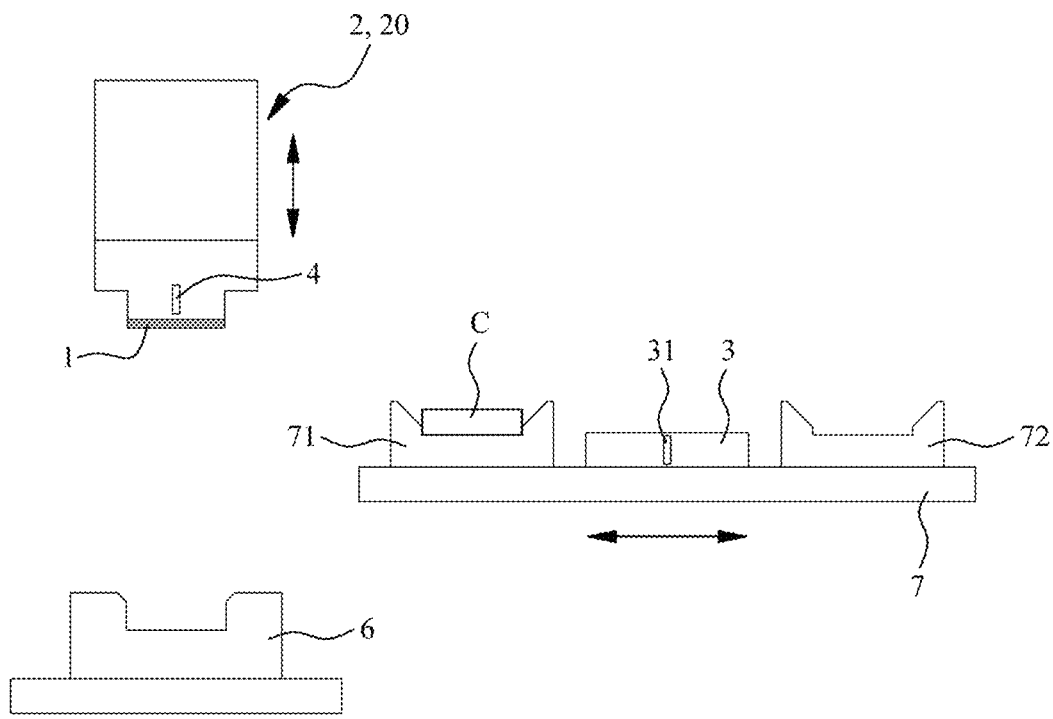
FIGS. 3A and 3B are schematic diagrams showing a detecting process of a thermal interface material according to the first embodiment of the present invention.
Figure 3B:
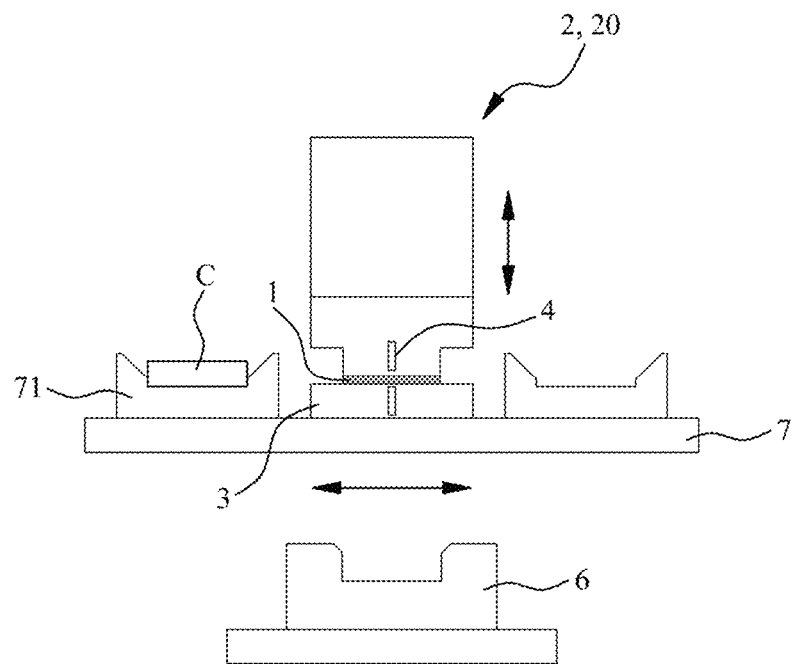

Reference is made to FIG. 2, FIG. 3A and FIG. 3B at the same time. FIG. 2 is a block diagram of an apparatus according to a first embodiment of the present invention, and FIGS. 3A and 3B are schematic diagrams showing a detecting process of a thermal interface material according to the first embodiment of the present invention. As shown in the figure, the apparatus of this embodiment mainly includes a movable carrier 2, a high temperature generating device 3, a temperature sensor 4, a controller 5, a test socket 6 and a shuttle 7. In this embodiment, the movable carrier 2 is a pressing head 20, the lower surface of which is provided with a thermal interface material 1, and the lower surface is a surface to be brought into contact with an electronic device C under test.

The thermal interface material includes: a thermal pad, a phase change material, a phase change metal alloy, a thermal conductive adhesive and a thermal grease. In this embodiment, since the thermal interface material 1 has to be frequently brought into contact with the electronic device C under test, a phase-change metal sheet, such as an indium sheet, is used. In addition, the temperature sensor 4 is provided in the pressing head 20. In general, the temperature sensor 4 can be used to detect the temperature of the electronic device C under test. In the case that the aging degree of the thermal interface material 1 is to be detected, the temperature sensor 4 can be used to detect the temperature of the thermal interface material 1.

The test socket 6 for accommodating and testing the electronic device C under test is disposed under the pressing head 20. The high temperature generating device 3 of this embodiment is a heater, which is disposed on the shuttle 7. An output temperature sensor 31 is provided in the high temperature generating device 3 for detecting the instant temperature of the high temperature generating device 3. The shuttle 7 is controlled by the controller 5 to slidably move to a position between the pressing head 20 and the test socket 6 or move away from the pressing head 20 and the test socket 6. The shuttle 7 is additionally provided with a chip-under-test holder 71 and a tested chip holder 72. The chip-under-test holder 71 is used for holding the electronic device C under test that has not yet been tested, and the tested chip holder 72 is used for holding the tested electronic device C.

Reference is made to FIG. 3A and FIG. 3B again. A detecting process of the thermal interface material provided by the first embodiment of the present invention will be described below. First, prior to execution of the test, the high temperature generating device 3 is heated to a preset first steady temperature T1, for example, 60° C., and the first steady temperature T1 is used as an output temperature datum. At the beginning of the test, the controller 5 controls the shuttle 7 to slidably move to a position between the pressing head and the test socket 6 so that the thermal interface material 1 beneath the pressing head 20 is aligned with the high temperature generating device 3. Next, the controller 5 controls the pressing head 20 to descend so as to move to the high temperature generating device 3 so that the thermal interface material 1 is brought into contact with the high temperature generating device 3, as shown in FIG. 3B.

At this time, the controller 5 controls the temperature sensor 4 on the pressing head 20 to detect the temperature of the thermal interface material 1 and to output a second steady temperature T2 as a temperature measurement datum. Finally, after the controller 5 receives the second steady temperature T2, the controller 5 compares the first steady temperature T1 with the second steady temperature T2. If the difference (ΔT) between the first steady temperature T1 and the second steady temperature T2 is greater than or equal to 5° C., the controller 5 issue a warning for notifying a field operator to replace the thermal interface material.

If the thermal interface material 1 with good thermal conductivity is brought into contact with the high temperature generating device 3, the thermal interface material 1 should be immediately heated to 60° C. or to a temperature slightly lower than 60° C. A great temperature difference between the two main surfaces of the thermal interface material 1 brought into contact with the high temperature generating device 3 and the temperature sensor 4 respectively means that the thermal interface material 1 has a large thermal resistance and should be replaced and that the thermal conduction performance thereof is deteriorated seriously, likely causing the test failure.

As can be seen from the above, this embodiment provides an effective, simple and low-cost aging test mechanism for a thermal interface material. As long as the aging degree of the thermal interface material is determined in advance before execution of the test, the test failure caused by the performance degradation of the thermal interface material 1, which affects the yield rate detection, can be completely prevented. Downtime caused by the inspection and replacement of the thermal interface material 1 during the testing process, which affects machine efficiency, can also be prevented.

Figure 4A:
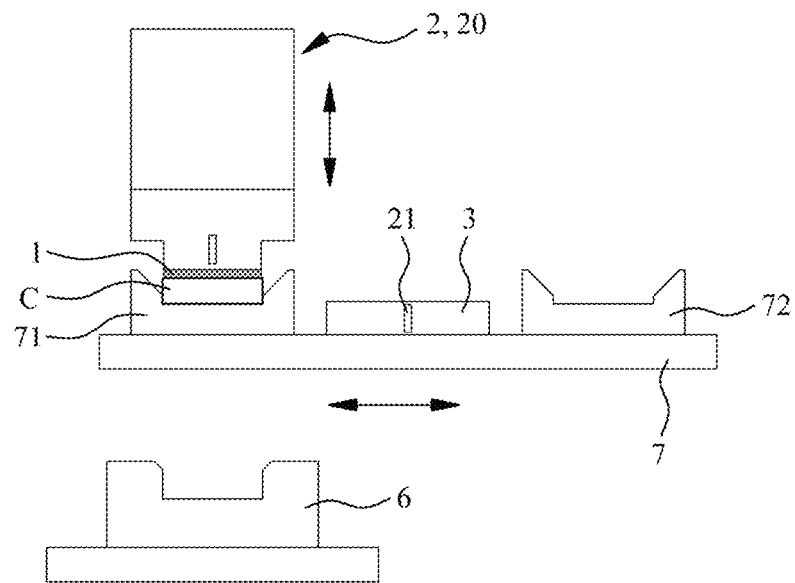
FIGS. 4A to 4C are schematic diagrams showing a testing process of an electronic device according to the first embodiment of the present invention.
Figure 4B:
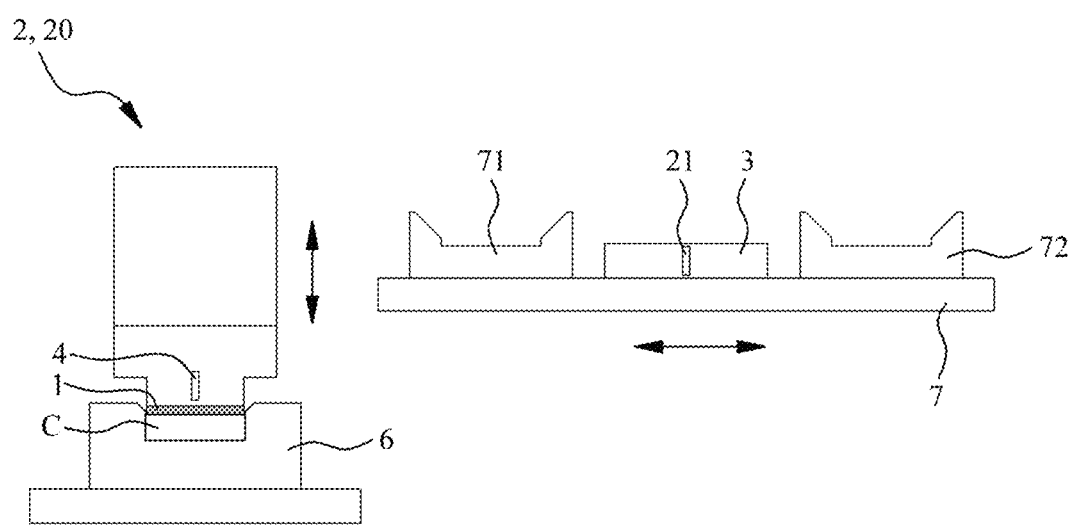
Figure 4C:
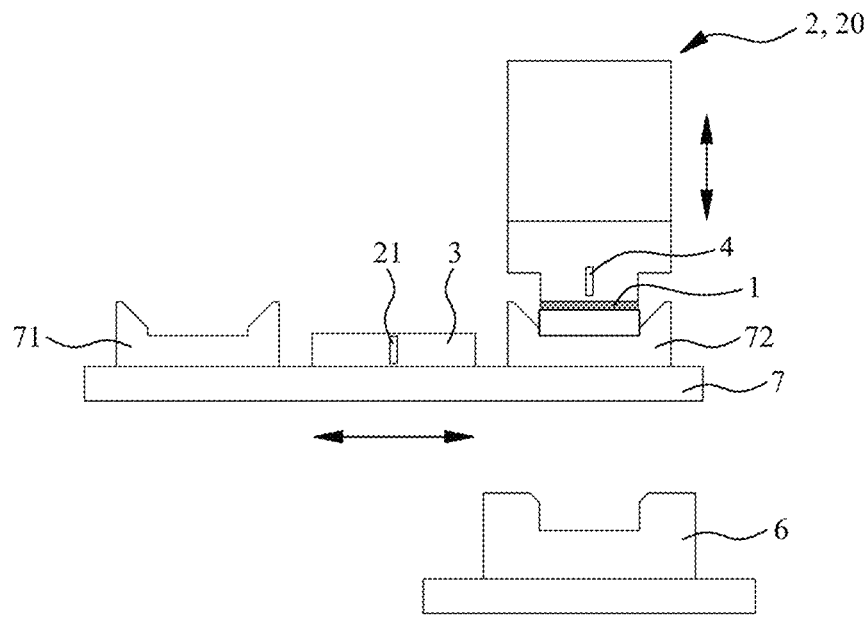

Reference is made to FIG. 4A to FIG. 4C, which are schematic diagrams showing a testing process of an electronic device according to the first embodiment of the present invention. The operation of an electronic device testing apparatus according to the first embodiment of the present invention will be briefly described below. In case that the controller determines from the test result of the thermal interface material 1 that the thermal interface material 1 does not need to be replaced, the test of the electronic device C under test can be executed. First, the shuttle 7 is controlled to slidably move to a position between the pressing head 20 and the test socket 6 by the controller 5, and the pressing head 20 descends and picks up the electronic device C under test from the chip-under-test holder 71, as shown in FIG. 4A.

After the pressing head 20 picks up the electronic device under test, the pressing head 20 ascends, and the shuttle 7 is controlled to move away from the pressing head 20 and the test socket 6. Next, the pressing head 20 descends and places the electronic device C under test into the test socket 6 for execution of the test, as shown in FIG. 4B. When the test is completed, the pressing head 20 picks up the tested electronic device C and ascends, and the shuttle 7 moves to the position between the pressing head 20 and the test socket 6 again, and then, the pressing head 20 holding the tested electronic device C descends and places the tested electronic device C into the tested chip holder 72, as shown in FIG. 4C. The entire testing process is completed.

Figure 5:
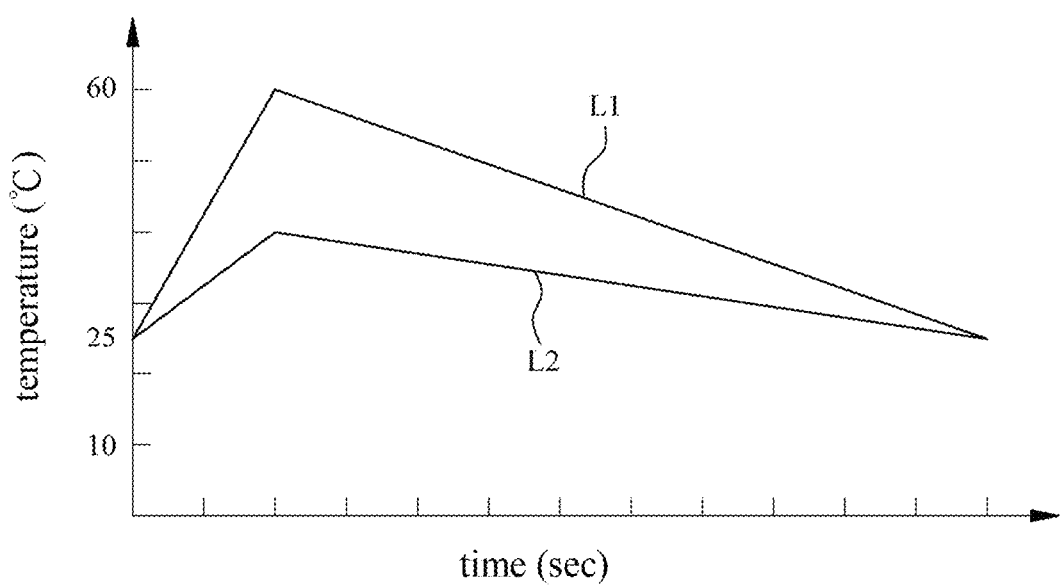
FIG. 5 is a time-temperature graph showing the relationship between an output temperature datum and a temperature measurement datum according to a second embodiment of the present invention.

Reference is made to FIG. 5, which is a time-temperature graph showing the relationship between an output temperature datum and a temperature measurement datum according to a second embodiment of the present invention. In the first embodiment, two steady temperatures one of which is a steady temperature of the high temperature generating device 3 (maintained at 60° C.) and the other of which is a steady temperature detected by the temperature sensor 4 are compared by the controller 5. On the other hand, in the second embodiment, transient temperatures changes are compared by the controller 5.

After the thermal interface material 1 is brought into contact with the high temperature generating device 3, the controller controls the high temperature generating device 3 to generate a transient temperature change during a time period. For example, the controller 5 inputs a current surge to the high temperature generating device 3 so that the high temperature generating device 3 generates the transient temperature change during the time period, that is, an output temperature curve L1 as shown in FIG. 5. On the other hand, the controller 5 controls the temperature sensor 4 to detect the temperature of the thermal interface material 1 during the same time period and outputs a temperature measurement change as the temperature measurement datum, that is, a temperature measurement curve L2 as shown in FIG. 5.

However, as shown in FIG. 5, the slope of the output temperature curve L1 in the heating phase and the cooling phase and the maximum temperature of the output temperature curve L1 are apparently different from the slope of the temperature measurement curve L2 in the heating phase and the cooling phase and the maximum temperature of the temperature measurement curve L2, so it can be determined that the thermal interface material 1 has deteriorated seriously and has to be replaced. Accordingly, by means of the test method provided in the second embodiment, various performance data of the thermal interface material 1, such as thermal conductive efficiency and limiting temperature, can be obtained.

Figure 6:
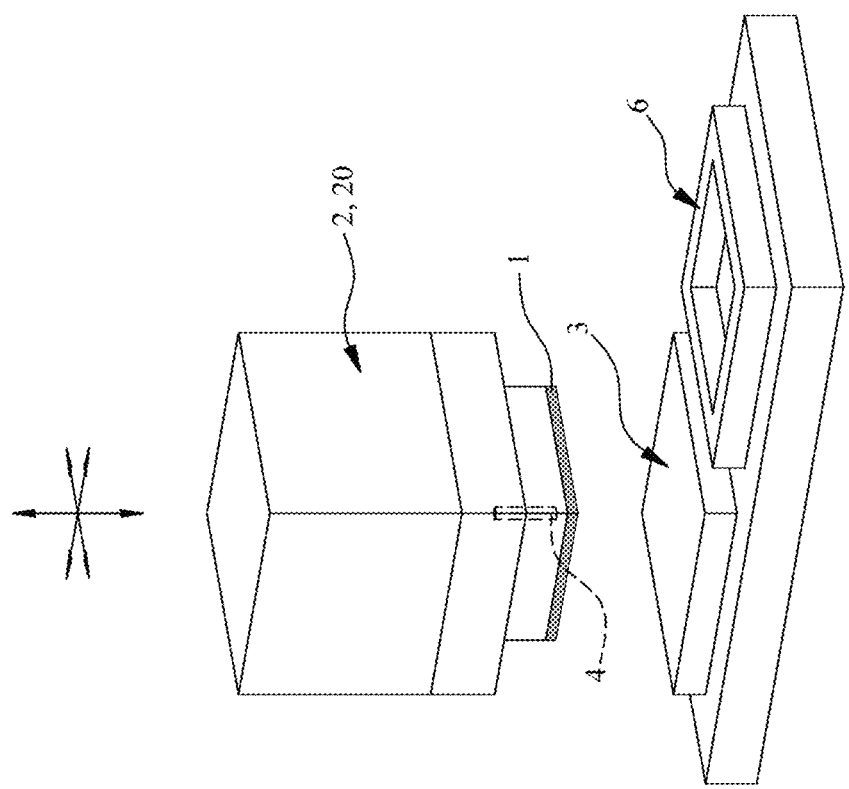
FIG. 6 is a schematic diagram of an apparatus according to a third embodiment of the present invention.
Figure 6:
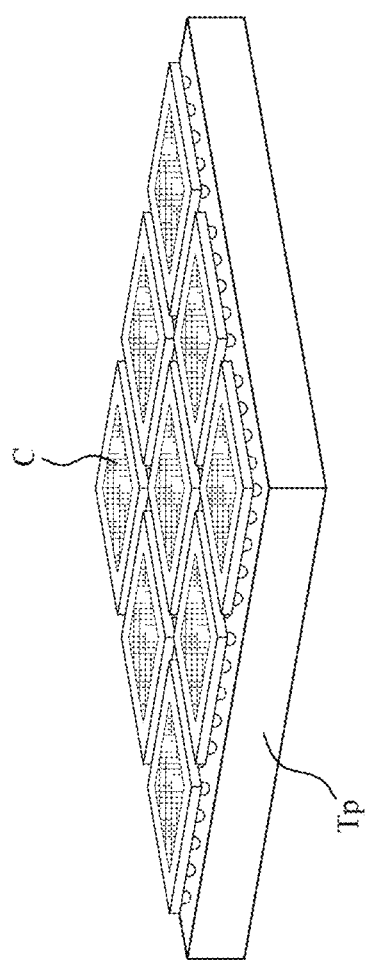

Reference is made to FIG. 6, which is a schematic diagram of an apparatus according to a third embodiment of the present invention. The third embodiment is different from the second embodiment in that the third embodiment does not include the shuttle 7, and the pressing head 20 of the third embodiment is capable of moving in three dimensional directions. As shown in FIG. 6, the high temperature generating device 3 can be disposed at one side of the test socket 6 or at other appropriate places. When the aging degree of the thermal interface material 1 is to be detected, the pressing head 20 is moved to a position above the high temperature generating device 3 and descends to be in contact with the high temperature generating device 3 for execution of detection of the aging degree of the thermal interface material 1. On the other hand, when the electronic device is to be tested, the pressing head 20 is moved to a tray or a temperature control platform TP to pick up the electronic device C under test and then to transfer it into the test socket 6 for execution of the test of the electronic device C. In brief, the present invention is also applicable to the movable carrier 2 capable of moving in three dimensional directions.

The preferred embodiments of the present invention are illustrative only, and the claimed inventions are not limited to the details disclosed in the drawings and the specification. Accordingly, it is intended that it have the full scope permitted by the language of the following claims.

What is claimed is:

1. An aging test system for a thermal interface material, the thermal interface material being disposed on a movable carrier, the system comprising:
   a high temperature generating device, controlled to output a steady temperature or a transient temperature change as an output temperature datum;
   at least one temperature sensor, disposed on the movable carrier, the at least one temperature sensor being controlled to detect a temperature of the thermal interface material as a temperature measurement datum; and
   a controller, electrically connected to the movable carrier, the high temperature generating device, and the at least one temperature sensor, wherein the controller controls the movable carrier to move to the high temperature generating device so that the thermal interface material is brought into contact with the high temperature generating device; the controller controls the at least one temperature sensor to detect the temperature of the thermal interface material;
   the controller compares the output temperature datum of the high temperature generating device with the temperature measurement datum detected by the at least one temperature sensor.

2. The aging test system of claim 1, wherein the controller controls the high temperature generating device to output a first steady temperature, and the output temperature datum includes the first steady temperature; the at least one temperature sensor detects the temperature of the thermal interface material as a second steady temperature, and the temperature measurement datum includes the second steady temperature; the controller compares the first steady temperature with the second steady temperature; when difference between the first steady temperature and the second steady temperature is greater than or equal to 5° C., the controller issue a warning.

3. The aging test system of claim 1, wherein after the thermal interface material is brought into contact with the high temperature generating device, the controller controls the high temperature generating device to generate the transient temperature change during a time period, and the output temperature datum includes the transient temperature change generated by the high temperature generating device during the time period; the temperature measurement datum includes a temperature change detected by the at least one temperature sensor during the time period.

4. The aging test system of claim 3, wherein after the thermal interface material is brought into contact with the high temperature generating device, the controller inputs a current surge to the high temperature generating device so that the high temperature generating device generates the transient temperature change during the time period.

5. An electronic device testing apparatus, comprising:
   a pressing head, including a thermal interface material;
   a high temperature generating device, controlled to output a steady temperature or a transient temperature change as an output temperature datum;
   at least one temperature sensor, disposed on the pressing head, the at least one temperature sensor being controlled to detect a temperature of the thermal interface material as a temperature measurement datum;
   a test socket, for accommodating an electronic device under test; and
   a controller, electrically connected to the pressing head, the high temperature generating device, the at least one temperature sensor and the test socket, wherein the controller controls the pressing head to move to the high temperature generating device so that the thermal interface material is brought into contact with the high temperature generating device;
   the controller controls the at least one temperature sensor to detect the temperature of the thermal interface material;
   the controller compares the output temperature datum of the high temperature generating device with the temperature measurement datum detected by the at least one temperature sensor.

6. The electronic device testing apparatus of claim 5, further comprising a shuttle, wherein the high temperature generating device is arranged on the shuttle, the shuttle is electrically connected to the controller and controlled to move to a position between the pressing head and the test socket or move away from the pressing head and the test socket.

7. The electronic device testing apparatus of claim 5, wherein the high temperature generating device is disposed at one side of the test socket, and the pressing head is controlled to move so as to be selectively brought into contact with the high temperature generating device or the test socket.

8. An aging test method for a thermal interface material, comprising the steps of:
   (A) controlling a movable carrier to move to a high temperature generating device by a controller so that a thermal interface material on the movable carrier is brought into contact with the high temperature generating device, wherein the high temperature generating device is controlled to output a steady temperature or a transient temperature change as an output temperature datum;
   (B) controlling at least one temperature sensor on the movable carrier to detect a temperature of the thermal interface material and to output a temperature measurement datum by the controller; and
   (C) comparing the output temperature datum of the high temperature generating device with the temperature measurement datum detected by the at least one temperature sensor by the controller.

9. The aging test method of claim 8, wherein in the step (A), the controller controls the high temperature generating device to output a first steady temperature, and the output temperature datum includes the first steady temperature; in the step (B), the at least one temperature sensor detects the temperature of the thermal interface material as a second steady temperature, and the temperature measurement datum includes the second steady temperature; in the step (C), the controller compares the first steady temperature with the second steady temperature, and when difference between the first steady temperature and the second steady temperature is greater than or equal to 5° C., the controller issues a warning.

10. The aging test method of claim 8, wherein in the step (A), after the thermal interface material is brought into contact with the high temperature generating device, the controller controls the high temperature generating device to generate the transient temperature change during a time period, and the output temperature datum includes the transient temperature change generated by the high temperature generating device during the time period; in the step (B), the controller controls the at least one temperature sensor to detect the temperature of the thermal interface material during the time period and to output a temperature change as the temperature measurement datum.

\* \* \* \* \*